(12) United States Patent
Jäntti (10) Patent No.: US 6,516,206 B2
(45) Date of Patent: Feb. 4, 2003

(54) TRANSCEIVER OPERATION IN RADIO SYSTEM (75) Inventor: Arto Jäntti, Oulu (FI)

(73) Assignee: Nokia Networks Oy, Espoo (FI)

( * ) Notice: Subject to any disclaimer, the term of this patent is extended or adjusted under 35 U.S.C. 154(b) by 0 days.

(21) Appl. No.: 09/865,479

(22) Filed: May 29, 2001

(65) Prior Publication Data
US 2001/0036842 A1 Nov. 1, 2001

Related U.S. Application Data (63) Continuation of application No. PCT/FI00/00825, filed on Sep. 27, 2000.

(30) Foreign Application Priority Data

Sep. 30, 1999 (FI) .................................................. 992113

(51) Int. Cl.⁷ ............................ H04B 1/38; H04B 1/06
(52) U.S. Cl. ....................... 455/561; 455/275; 455/562
(58) Field of Search .......................... 455/59, 101–103, 455/561–562, 132, 133, 137, 272–273, 275

(56) References Cited

U.S. PATENT DOCUMENTS

| 5,175,878 A | * | 12/1992 | Davis et al. ................. 455/103 |
| 5,214,787 A | * | 5/1993 | Karkota, Jr. ................. 455/102 |
| 5,774,017 A | | 6/1998 | Adar |
| 5,842,117 A | * | 11/1998 | Rosenberg et al. .......... 455/101 |
| 5,852,651 A | | 12/1998 | Fischer et al. |
| 5,933,766 A | * | 8/1999 | Dent ........................... 455/103 |
| 6,148,218 A | * | 11/2000 | Solondz ...................... 455/562 |
| 6,411,825 B1 | * | 6/2002 | Csapo et al. ................. 455/550 |

FOREIGN PATENT DOCUMENTS

| EP | 813 310 | 12/1997 |
| EP | 886 384 | 12/1998 |
| EP | 926 844 | 6/1999 |
| EP | 1 005 245 | 5/2000 |
| WO | WO 00/39943 | 7/2000 |

* cited by examiner

Primary Examiner—Charles N. Appiah
(74) Attorney, Agent, or Firm—Pillsbury Winthrop LLP (57) ABSTRACT The invention relates to a method of implementing transceiver operation at a base station. In the method, at least two transmitter units (300, 302) in different sectors transmit signals at different frequencies to the same multifrequency amplifier (306), and the signals amplified by the multifrequency amplifier (306) are transmitted to a filter structure (500), which filters signals to be transmitted at different frequencies. In the method sector-specific antennas (418, 420) transmit and receive the signals at different frequencies and the filter structure (500) filters the at least two signals received at different frequencies. The filtered signals are transmitted via the filter unit (400) to the receiver amplifier (404), whereupon the signals received from the different sectors are transmitted to sector-specific receiver amplifiers (406, 408).

16 Claims, 5 Drawing Sheets

TRANSCEIVER OPERATION IN RADIO SYSTEM

This is a Continuation of International Application PCT/FI/00825 which was filed on Sep. 27, 2000 and designated the U.S. and which was filed in English.

FIELD OF THE INVENTION

The invention relates to a method and an arrangement for implementing transceiver operation in a radio system in for example third generation mobile systems.

BACKGROUND OF THE INVENTION

The object of the third generation mobile system UMTS (Universal Mobile Telecommunication System) is successful integration of the different sub areas of telecommunication. The UMTS is based on the spread spectrum technology, which has previously been used in military applications. In the spread spectrum technology, several users are able to simultaneously use the same frequency band. The spread spectrum technology comprised by the UMTS is typically implemented by the WCDMA technology (Wideband Code Division Multiple Access). The potential data transmission capacity in the UMTS is significantly higher than for example in the GSM technology.

The base stations in a mobile system are usually sectored to enhance transceiver operation. In accordance with prior art, the transmitter functions of two sectors having different carriers are implemented with different transmitters. Each sector-specific transmitter comprises a transmitter unit, a power amplifier and a filter unit, and cables between these units. The drawbacks of said separate structures include high costs due to the amounts of components and different cables called for by the separate structures. The minimization of transmission losses requires large, and expensive, cables at the base station. Separate structures require relatively much space owing to the large size of the power amplifier, in particular. Radio systems based on the WCDMA technology require the use of expensive and complex linear amplifiers as power amplifiers in transmitter operation. The need for a separate linear amplifier for each transmitter is a significant drawback.

Receivers are typically also connected to said sector-specific transmitters, i.e. transceivers are involved. The reception operation of transceivers can be implemented by the use of diversity, i.e. two or more receivers receive simultaneously from the same sector. Diversity can be utilized for example by eliminating spurious signals from the desired signal by comparing the received signals. This means that said drawbacks associated with the transmitter block also exist in reception, which is further emphasized when diversity is used in the implementation of the reception. The transceiver of each sector requires a receiver amplifier and cabling, which further increases the costs.

BRIEF DESCRIPTION OF THE INVENTION

It is thus the object of the invention to implement a method and an apparatus for implementing the method so as to solve the above problems. This is achieved by an arrangement for implementing transmitter operation at a base station, the arrangement comprising a power amplifier for amplifying signals to be transmitted. The power amplifier in the arrangement is a multifrequency amplifier, and the arrangement comprises in different sectors at least two transmitter units for generating signals at different frequencies, connected to the same multifrequency amplifier, a filter unit comprising transmitter filters for said signals to be transmitted, a separate cable for transmitting signals between the multifrequency amplifier and the filter unit, and in different sectors at least two antennas for transmitting signals to their sectors, and at least two antenna cables, each antenna being connected with its antenna cable to its transmitter filter in the filter unit.

The invention also relates to an arrangement for implementing transceiver operation at a base station, the arrangement comprising a power amplifier for amplifying signals to be transmitted, and a first receiver amplifier for amplifying received signals. The power amplifier in the arrangement is a multifrequency amplifier, and the arrangement further comprises in different sectors at least two transmitter units for generating signals at different frequencies, connected to the same multifrequency amplifier, a filter structure comprising as filters at least two different transmitter filters and at least two different receiver filters for filtering signals to be transmitted and received, in different sectors at least two antennas for transmitting and receiving signals, and at least two antenna cables, each antenna being connected with its antenna cable to at least one transmitter filter and to at least one receiver filter in the filter structure, a filter unit for filtering further the received signals, a first receiver amplifier connected to at least two sector-specific receiver amplifiers, and a separate cable for transmitting signals between the multifrequency amplifier and the filter unit, between the filter unit and the filter structure, and between the filter unit and the first receiver amplifier.

The invention also relates to an arrangement for implementing receiver diversity transceiver operation at a base station, the arrangement comprising a power amplifier for amplifying signals to be transmitted, and a first receiver amplifier for amplifying signals received. The power amplifier in the arrangement is a multifrequency amplifier, and the arrangement comprises in different sectors at least two transmitter units for generating signals at different frequencies, connected to the same multifrequency amplifier, a filter structure comprising as filters at least two different transmitter filters and at least two different receiver filters for filtering signals to be transmitted and received, at least two antennas and antenna cables in different sectors, each antenna being connected with its antenna cable to at least one transmitter filter and to at least one receiver filter in the filter structure, a filter unit for filtering further the received signals, a first receiver amplifier connected to at least two sector-specific receiver amplifiers, a separate cable for transmitting signals between the multifrequency amplifier and the filter unit, between the filter unit and the filter structure and between the filter unit and the first receiver amplifier, and at least one receiver branch in said sectors connected to said sector-specific receiver amplifiers.

The invention also relates to a method of implementing transmitter operation at a base station, in which method a power amplifier amplifies signals to be transmitted. Further in the method, at least two transmitter units in different sectors transmit signals at different frequencies to the same multifrequency amplifier acting as the power amplifier, the signals amplified by the multifrequency amplifier are transmitted by a separate cable to a filter unit and the filter unit filters the signals to sector-specific antennas.

The invention further relates to a method of implementing transceiver operation at a base station, in which method a power amplifier amplifies signals to be transmitted, and a first receiver amplifier amplifies signals received. Further in the method, at least two transmitter units in different sectors transmit signals at different frequencies to the same multifrequency amplifier acting as the power amplifier, the signals amplified by the multifrequency amplifier are transmitted by a separate cable from the multifrequency amplifier to a filter structure, the filter structure filters at least two signals to be transmitted at different frequencies, sector-specific antennas transmit the signals to be transmitted at different frequencies, and receive the signals to be received at different frequencies, the filter structure filters the at least two signals received at different frequencies, the received signals are further filtered with a filter unit and the filtered received signals are transmitted along a separate cable from the filter structure via the filter unit to the same first receiver amplifier that amplifies said signals, whereupon the signals received from the different sectors are transmitted to sector-specific receiver amplifiers.

The invention further relates to a method of implementing receiver diversity transceiver operation at a base station, in which method a power amplifier amplifies signals to be transmitted, and a first receiver amplifier amplifies signals received. Further in the method, at least two transmitter units in different sectors transmit signals at different frequencies to the same multifrequency amplifier acting as the power amplifier, the signals amplified by the multifrequency amplifier are transmitted by a separate cable from the multifrequency amplifier to a filter structure, the filter structure filters at least two signals to be transmitted at different frequencies, sector-specific antennas transmit the signals to be transmitted at different frequencies, and receive the signals to be received at different frequencies, the filter structure filters the at least two signals received at different frequencies, the received signals are further filtered with a filter unit, the filtered received signals are transmitted along a separate cable from the filter structure via the filter unit to the same first receiver amplifier that amplifies said signals, whereupon the signals received from the different sectors are transmitted to sector-specific receiver amplifiers, and signals are received from said sectors at least at one receiver branch, from which the received signals are transmitted to said sector-specific receiver amplifiers.

The preferred embodiments of the invention are disclosed in the dependent claims.

The invention is based on the idea that at least two transmitter units in different sectors transmit signals at different frequencies to the same multifrequency amplifier that acts as a power amplifier and amplifies said signals. After the amplification, the signals are transmitted along separate cables to a filter unit in which sector-specific transmitter filters filter the amplified signals apart into antenna branches of their sectors, in which branches the signals are transferred along a sector-specific antenna cable to a sector-specific antenna.

The invention is also based on filtering signals that are at different frequencies and are transmitted to a multifrequency amplifier by transmitter units of at least two different sectors and amplified by the multifrequency amplifier with sector-specific transmitter filters in a filter structure, wherein signals received from said sectors at different frequencies are also filtered in sector-specific receiver filters. After said filtration, the received signals are transmitted along a separate cable via a filter unit to a first receiver amplifier, from which each signal is applied to a sector-specific receiver amplifier.

The method and arrangement of the invention provide significant advantages. Implementing transmitter operation or transceiver operation according to the invention brings about major financial savings, since only one power amplifier, in the invention a multifrequency amplifier, is needed for at least two transmitter units in a transmitter. This typically also means that only one power amplifier is needed for at least two sectors. Particularly in radio systems based on the WCDMA technology, in which linear amplifiers have to be used as power amplifiers, reducing number of linear amplifiers by at least a half leads to considerable financial savings. In the same way, this also brings about important savings in space, since linear amplifiers, in particular, are bulky. A further advantage of the invention is that is allows common separate cablings to be used for signals transmitted by both transmitter units and, similarly, for signals received in reception. The need for fewer cables also means considerable savings, since the cables used for said purpose in a base station are extremely expensive. Furthermore, as regards a transceiver, a reduction in the number of first receiver amplifiers leads to savings both in costs and space, which increases in importance when the receiver operation is implemented by the use of diversity.

BRIEF DESCRIPTION OF THE FIGURES

The invention will now be described in greater detail by preferred embodiments with reference to the attached figures, of which

DETAILED DESCRIPTION OF THE INVENTION

Figure 1:
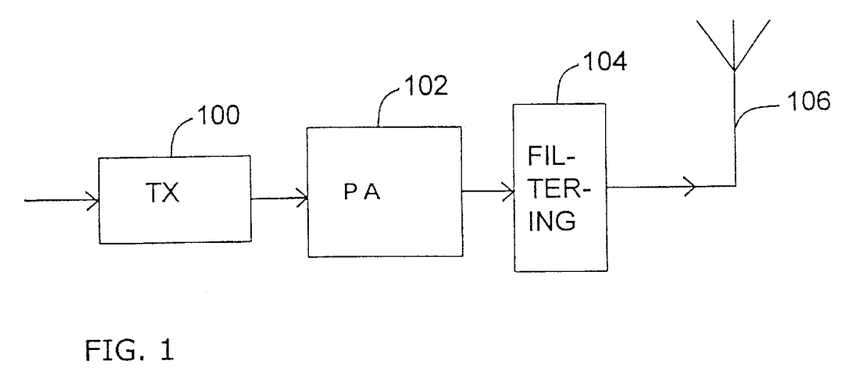
FIG. 1 is a basic block diagram of a transmitter used in radio systems.

A transmitter in a radio system comprises a signal block 100, an amplifying block 102, a filter unit 104 and an antenna 106, as is shown in FIG. 1. The signal block generates a signal to be transmitted, which is amplified in the amplifying block. Spurious signals are filtered from the signal, typically by band-pass filtration, in the filter unit, whereupon the antenna transmits the signal to the radio path.

Figure 2:
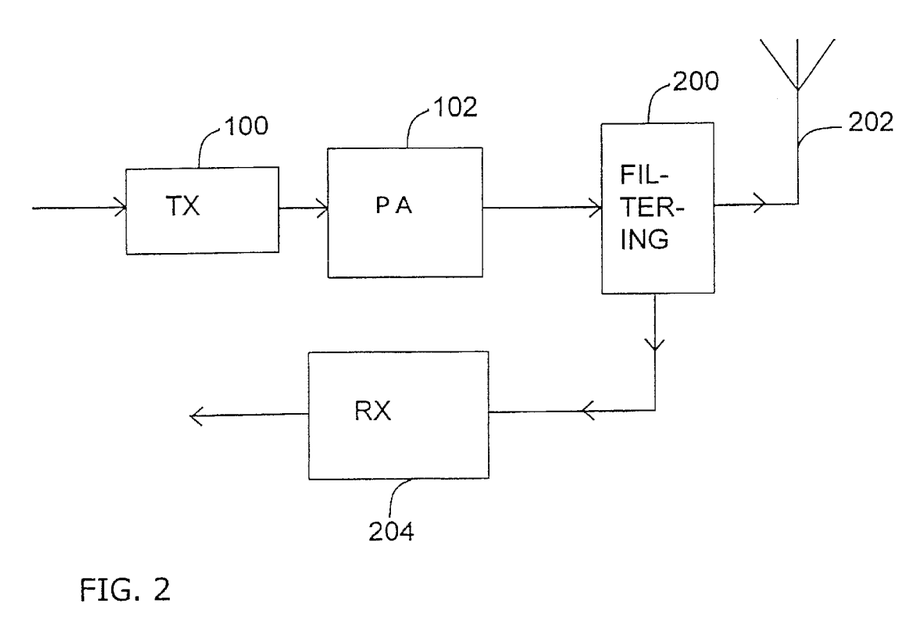
FIG. 2 is a basic block diagram of a transceiver used in radio systems.

In a radio system, a transmitter and a receiver are typically integrated forming a transceiver whose basic block diagram is shown in FIG. 2. In addition to the following tasks related to reception, the transmitter operation of the transceiver is similar to that described for the transmitter of FIG. 1. In addition to the functions associated with a signal to be transmitted and described for the filter unit 104 of FIG. 1, the filter block also filters the signal received by an antenna 202 to a receiver block 204. The receiver block amplifies the received and filtered signal to a power level and optionally carries out other further processing of the received signal, which is, however, irrelevant to the invention.

Figure 3:
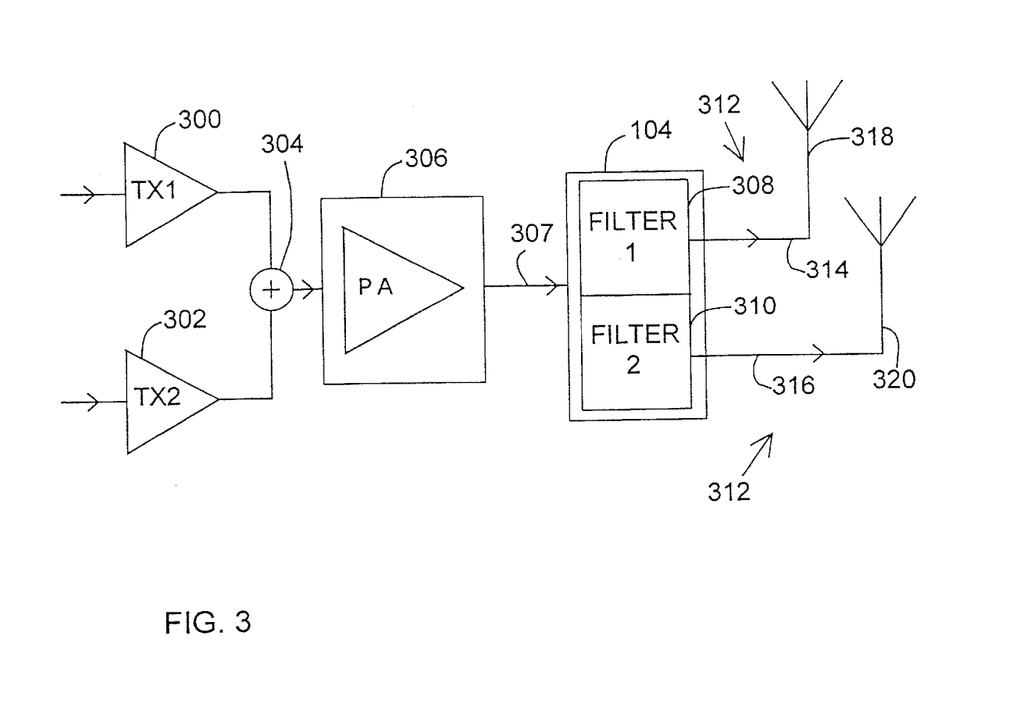
FIG. 3 shows a first preferred embodiment of the invention.

In a first preferred embodiment of the invention, shown in FIG. 3, the transmitter operation of two sectors is arranged in a centralized manner. The signal block 100 comprises for different sectors two transmitter units 300, 302 for generating the signals to be transmitted. Said signals generated by the different transmitter units have different frequencies.

These different frequencies are typically implemented by generating in each transmitter unit for the signal a carrier that is on a different frequency than a carrier generated by another transmitter unit. The carrier is a wave with which a signal is modulated. In the modulation, the signal to be transmitted, including information, is combined with the carrier is the transmitter unit. When carriers are at different frequencies, they are typically on entirely different frequency ranges, or frequency bands.

The method and arrangement of the invention typically utilizes the WCDMA technology, associated with which linear modulation is used in signal processing. Referring still to FIG. 3, the signals having different carrier frequencies and modulated by the transmitter units are combined in an adder in the transmitter block. The adder is typically of the Wilkinson type, such as a Wilkinson hybrid adder. After the combination, the signals are amplified in a multifrequency amplifier 304 acting as the power amplifier of the amplifier block 102. In a system according to the WCDMA technology, a linear amplifier is used as the power amplifier 306, which enables the simultaneous processing of several signals at different frequencies. Herein, simultaneity means that signals at different frequencies are combined into signals combined with for example the adder 304, as was described above. In a typical case according to the invention, the multifrequency amplifier thus simultaneously amplifies at least two combined signals at different carrier frequencies.

Still referring to FIG. 3, the amplified combined signals are transmitted from the multifrequency amplifier along a separate cable 307 to the filter unit 104. The combined signals are filtered in the filter unit, which comprises a transmitter filter 308, 310, typically a band-pass filter, for the signals transmitted by each transmitter unit 300, 302. In other words, the filters are sector-specific. A filter unit of the above-described type is usually a duplex filter, in which the same filter structure comprises two band-pass filters of different frequency ranges, or pass bands. Not only can the band-pass filter of the duplex filter filter signals to be transmitted, but it can also filter signals to be received as is described in the second preferred embodiment of the invention. The pass bands of said band-pass filters are typically entirely different. Since the signals generated by the different transmitter units are on entirely different carrier frequency ranges, the band-pass filters of said frequency ranges can be used to filter said simultaneous signals. The desired signals to be transmitted are filtered from the signal combined in the above-described manner into separate sector-specific antenna branches 312. In the antenna branches, the signals to be transmitted are transmitted along sector-specific antenna cables 314, 316 to sector-specific antennas 318, 320, via which the signals are transmitted to their sectors.

Figure 4:
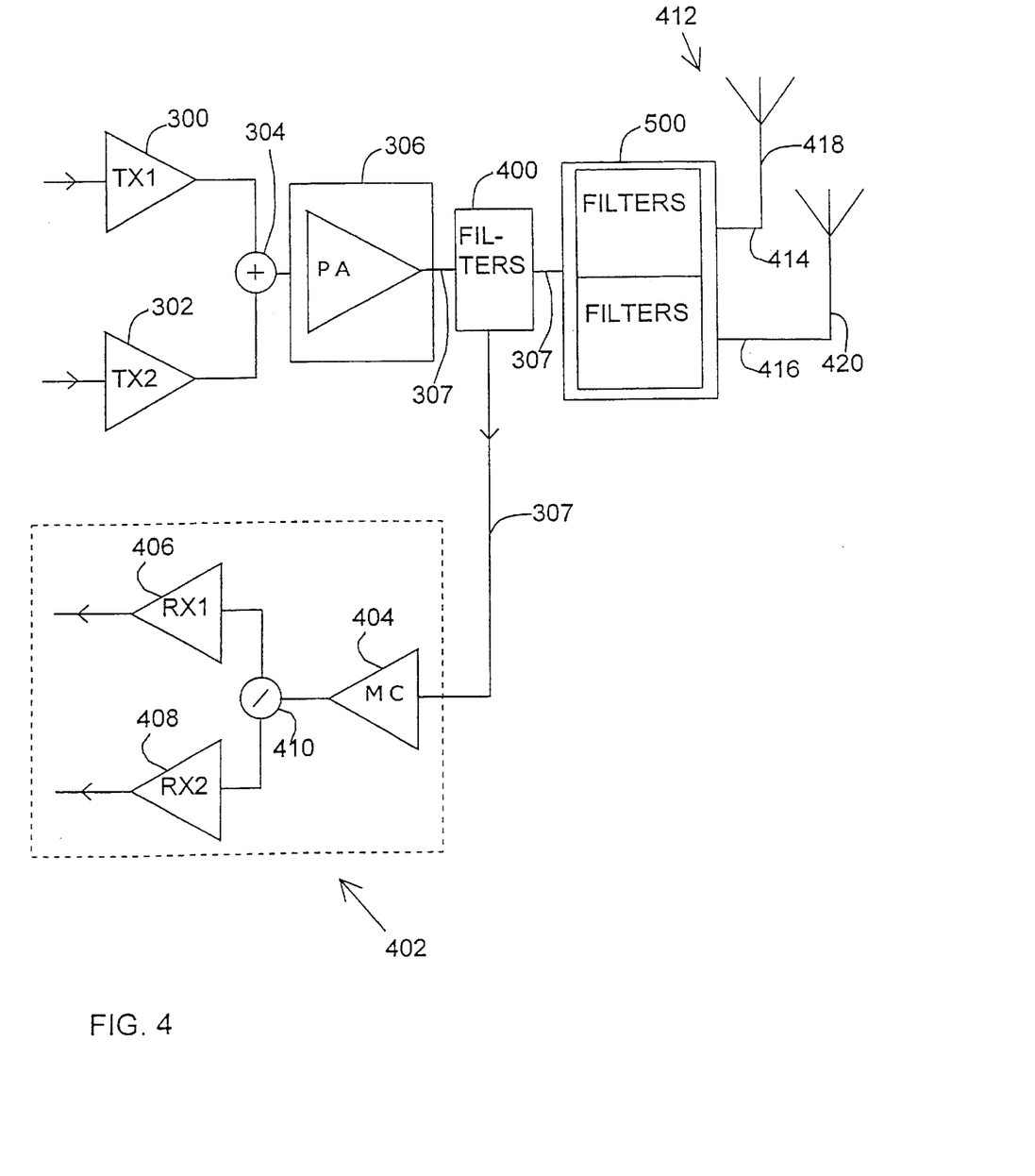
FIG. 4 shows a second preferred embodiment of the invention.

FIG. 4 shows a second preferred embodiment of the invention, which corresponds to the above-described first preferred embodiment in other respects except that in this embodiment the invention is implemented in a transceiver at a base station, causing the following differences as compared with the first preferred embodiment. A receiver is integrated into a transmitter forming a transceiver such that in a filter structure 200 in FIG. 5, sector-specific transmitter and receiver filters 500, 502, 504, 506 are able to filter at least two signals to be transmitted at different carrier frequencies and at least two signals to be received at different carrier frequencies. The carrier frequency signals to be transmitted and received also are at different frequencies. Said signals to be transmitted and received are in different sectors, however, such that the signals to be received are from sectors corresponding to those the signals to be transmitted are transmitted. The filter structure 200 of the invention thus comprises a band-pass filter 500, 502, 504, 506 for the signals of each carrier frequency range to be transmitted and received. Said filter structure may be for example a dual duplex filter comprising two duplex filters integrated into the same filter structure so that the filter structure implements the function of the invention for filtering at least two signals to be transmitted at different carrier frequencies and at least two signals to be received at two different carrier frequencies. Consequently, the band-pass filters of a duplex filter can be used for filtering both signals to be transmitted and those to be received, and the latter may also be carried out by the first band-pass filter of the same duplex filter filtering the signal to be transmitted and the second band-pass filter filtering the signal to be received. The signals are transmitted and received at sector-specific antenna branches 412, which comprise sector-specific antenna cables 414, 416 and antennas 418, 420.

Figure 5:
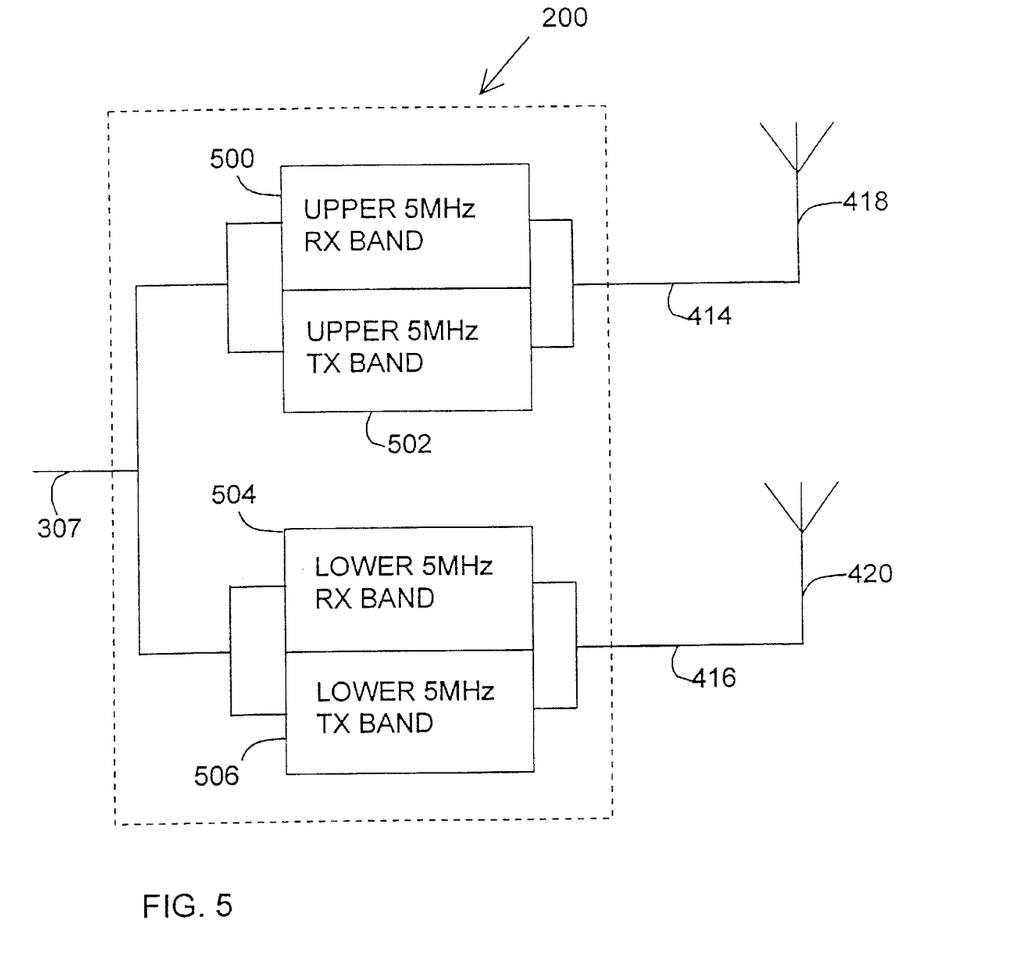
FIG. 5 shows the filter structure used in the second and third preferred embodiments of the invention.

Referring further to FIGS. 4 and 5, between the multifrequency amplifier and the filter structure is mounted a filter unit 400, which filters and thus differentiates the signals to be received to the receiver block 402 of the transceiver. The filter unit 400 is typically a duplex filter, which was described above in connection with FIG. 3. In said use, a duplex filter brings about the advantage that signal loss is only 0.5 dB. The receiver block comprises a first receiver amplifier 404 and sector-specific receiver amplifiers 406 to 408. The first receiver amplifier amplifies received signals, whereupon a divider 410 separates the received signals to sector-specific receiver amplifiers, which process further the sector-specific received signals. The divider is typically a passive divider, such as a Wilkinson hybrid divider. Separate cables 307 are used in the transmission of signals between the filter structure and the filter unit, and between the filter unit and the first receiver amplifier. Similarly, separate cables 307 are used between the multifrequency amplifier and the filter unit and between the first receiver amplifier and the divider.

Figure 6:
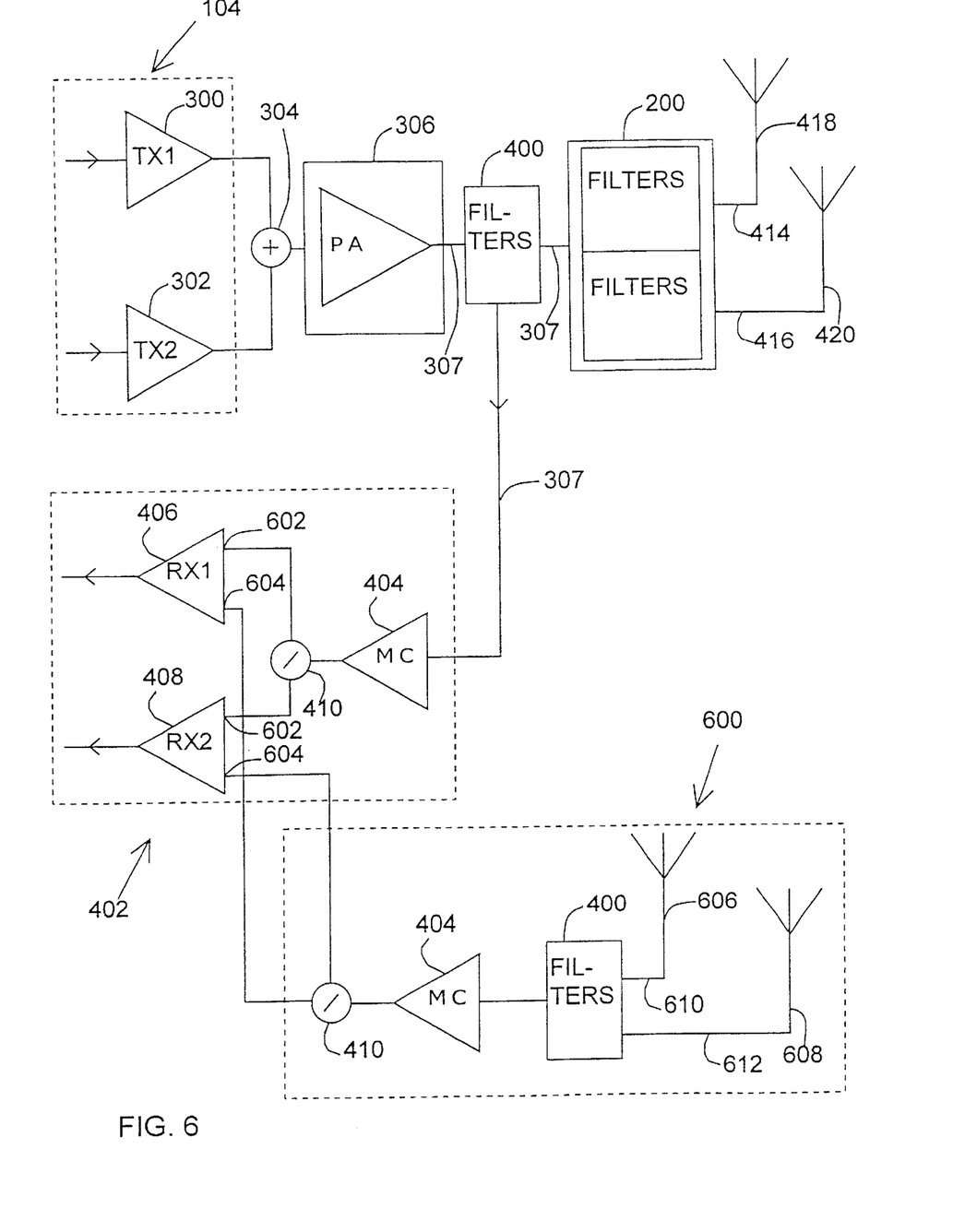
FIG. 6 shows a third preferred embodiment of the invention.

In a third embodiment of the invention, shown in FIG. 6, receiver diversity is implemented in the transceiver. Receiver diversity is used to reduce spurious signals in the received signals such that the simultaneous signals received via at least two different antennas are compared. In the signal processing of the comparison, at least two signals are used to deduce which part constitutes the desired signal. This allows spurious signals to be eliminated. The highest-quality signal received from each sector is typically subjected to said elimination of spurious signals.

Referring still to FIG. 6, in the third preferred embodiment of the invention, the receiver operation is implemented by the use of diversity in such a way that at least one receiver branch 600 is integrated into the transceiver according to the second preferred embodiment of the invention. The receiver branch is adapted to receive from at least one same sector, typically from all same sectors, as does the transceiver according to the second preferred embodiment of the invention. The third preferred embodiment shown in FIG. 6, the receiver branch receives from two same sectors, as does the transceiver. As described in the second preferred embodiment of the invention, the transceiver also transmits to said same sectors. The receiver branch 600 comprises sector-specific antennas 606, 608, connected with sector-specific antenna cables 610, 612 to their receiver filters in the filter unit 400, which is connected by a separate cable 307 to the first receiver amplifier 404. The filter unit 400 is also typically a duplex filter. The receiver branch further comprises a divider 410 connected to the first receiver amplifier by a separate cable, and separate cables from the divider to the sector-specific receiver amplifiers 406 to 408 of the receiver block. The signals received by the antennas from their sectors are filtered and combined in the filter unit, whereupon they are amplified in the first receiver amplifier. The divider divides the combined signals received from the different sectors and amplified by the first receiver amplifier to the sector-specific receiver amplifiers. Each sector-specific receiver amplifier thus comprises at least two inputs 602 to 604, to which the signals of the same sector, received by the transceiver and at least one receiver branch integrated into the transceiver, are applied for further processing of the signals. In the further processing of the signals, the signals may be further amplified and subjected to for example the above type of signal comparison, on the basis of which spurious signals are reduced from the received signal. Other aspects of the third preferred embodiment of the invention are similar to those in the second preferred embodiment.

In the preferred embodiments of the invention, the signals are typically radio frequency signals. All above preferred embodiment of the invention can be implemented for example in the radio system UMTS, which is based on the WCDMA technology and typically employs a 15-MHz band. Said band is composed of two 5-MHz carrier bands, between which is, when the present invention is utilized, a 5-MHz guard band, forming a 20-dB insulation between the carrier bands. The guard band is a protective band for protecting the bands of the desired signals, i.e. the signals of the above carrier bands, from interfering with each other. The filter structure 200 of the invention requires that a guard band be arranged between the carrier bands. The carrier frequencies in the preferred embodiments of the invention are thus in 5-MHz frequency bands, between which is arranged the above 5-MHz guard band. The WCDMA technology can be used similarly to also implement radio systems having different frequency bands, for example in such a manner that a 20-MHz frequency band is available. Said frequency band range can be arranged for example such that three 4-MHz carrier bands are used, between which are arranged 4-MHz guard bands. In this case the preferred embodiments of the invention are adapted to the above situation, i.e. the transmitter is adapted to three-sector transmitter operation and, similarly, the transceiver is adapted to three-sector transmitter and receiver operation, as is the transceiver, which implements diversity receiver operation. Regarding the transmitter units and different filters of the transmitter and the transceiver, the numbers of sector-specific receiver amplifiers correspond to the numbers of the different sectors, i.e. when three different sectors are involved, the number of each of the above is three. The same applies to the antennas and the separate cables.

The preferred embodiments of the invention can be adapted to the requirements of the frequency band employed as regards the number and widths of the carrier bands. Although in the above examples, the carrier bands and the guard bands are equal, this does not have to be the case, but the preferred embodiments of the invention can be also adapted to frequency bands of different sizes. The numerical values given above are naturally approximate values.

Although the invention has been described above with reference to the example according to the attached figures, it is obvious that the invention is not limited thereto, but can be modified in many ways within the scope of the inventive idea disclosed in the attached claims.

What is claimed is:

1. An arrangement for implementing transceiver operation at a base station, the arrangement comprising a power amplifier for amplifying signals to be transmitted, and a first receiver amplifier for amplifying received signals, wherein the power amplifier in the arrangement is a multifrequency amplifier, and that the arrangement comprises:

in different sectors at least two transmitter units for generating signals at different frequencies, connected to the same multifrequency amplifier;

a filter structure comprising as filters at least two different transmitter filters and at least two different receiver filters for filtering signals to be transmitted and received;

in different sectors at least two antennas for transmitting and receiving signals, and at least two antenna cables, each antenna being connected with its antenna cable to at least one transmitter filter and to at least one receiver filter in the filter structure;

a filter unit for filtering further the received signals;

a first receiver amplifier connected to at least two sector-specific receiver amplifiers, and a separate cable for transmitting signals between the multifrequency amplifier and, the filter unit, between the filter unit and the filter structure, and between the filter unit and the first receiver amplifier.

2. An arrangement as claimed in claim 1, wherein the arrangement is adapted to generate the signals at different frequencies by modulating them to entirely different carrier frequency ranges.

3. An arrangement as claimed in claim 2, wherein the arrangement is adapted to modulate the signals linearly.

4. An arrangement as claimed in claim 1, wherein the arrangement comprises an adder for combining the signals at different frequencies to the same multifrequency amplifier.

5. An arrangement for implementing receiver diversity transceiver operation at a base station, the arrangement comprising a power amplifier for amplifying signals to be transmitted, and a first receiver amplifier for amplifying signals received, wherein the power amplifier in the arrangement is a multifrequency amplifier, and that the arrangement comprises:

in different sectors at least two transmitter units for generating signals at different frequencies, connected to the same multifrequency amplifier;

a filter structure comprising as filters at least two different transmitter filters and at least two different receiver filters for filtering signals to be transmitted and received;

at least two antennas and antenna cables in different sectors, each antenna being connected with its antenna cable to at least one transmitter filter and to at least one receiver filter in the filter structure;

a filter unit for filtering further the received signals;

a first receiver amplifier connected to at least two sector-specific receiver amplifiers;

a separate cable for transmitting signals between the multifrequency amplifier and the filter unit, between the filter unit and the filter structure and between the filter unit and the first receiver amplifier, and at least one receiver branch in said sectors connected to said sector-specific receiver amplifiers.

6. An arrangement as claimed in claim 5, wherein the arrangement is adapted to generate the signals at different frequencies by modulating them to entirely different carrier frequency ranges.

7. An arrangement as claimed in claim 6, wherein the arrangement is adapted to modulate the signals linearly.

8. An arrangement as claimed in claim 5, wherein the arrangement comprises an adder for combining the signals at different frequencies to the same multifrequency amplifier.

9. A method of implementing transceiver operation at a base station, in which method a power amplifier amplifies signals to be transmitted, and a first receiver amplifier amplifies signals received, wherein at least two transmitter units in different sectors transmit signals at different frequencies to the same multifrequency amplifier acting as the power amplifier;

the signals amplified by the multifrequency amplifier are transmitted by a separate cable from the multifrequency amplifier to a filter structure;

the filter structure filters at least two signals to be transmitted at different frequencies;

sector-specific antennas transmit the signals to be transmitted at different frequencies, and receive the signals to be received at different frequencies;

the filter structure filters the at least two signals received at different frequencies;

the received signals are further filtered with a filter unit and the filtered received signals are transmitted along a separate cable from the filter structure via the filter unit to the same first receiver amplifier that amplifies said signals, whereupon the signals received from the different sectors are transmitted to sector-specific receiver amplifiers.

10. A method as claimed in claim 9, wherein the signals are at different frequencies in such a way that they are modulated to entirely different carrier frequency ranges.

11. A method as claimed in claim 10, wherein the signals are linearly modulated.

12. A method as claimed in claim 9, wherein the signals at different frequencies are combined with an adder to the same multifrequency amplifier.

13. A method of implementing receiver diversity transceiver operation at a base station, in which method a power amplifier amplifies signals to be transmitted, and a first receiver amplifier amplifies signals received, wherein at least two transmitter units in different sectors transmit signals at different frequencies to the same multifrequency amplifier acting as the power amplifier;

the signals amplified by the multifrequency amplifier are transmitted by a separate cable from the multifrequency amplifier to a filter structure;

the filter structure filters at least two signals to be transmitted at different frequencies;

sector-specific antennas transmit the signals to be transmitted at different frequencies, and receive the signals to be received at different frequencies;

the filter structure filters the at least two signals received at different frequencies;

the received signals are further filtered with a filter unit;

the filtered received signals are transmitted along a separate cable from the filter structure via the filter unit to the same first receiver amplifier that amplifies said signals, whereupon the signals received from the different sectors are transmitted to sector-specific receiver amplifiers, and signals are received from said sectors at least at one receiver branch, from which the received signals are transmitted to said sector-specific receiver amplifiers.

14. A method as claimed in claim 13, wherein the signals are at different frequencies in such a way that they are modulated to entirely different carrier frequency ranges.

15. A method as claimed in claim 14, wherein the signals are linearly modulated.

16. A method as claimed in claim 13, wherein the signals at different frequencies are combined with an adder to the same multifrequency amplifier.

* * * * *